United States Patent [19]
Katou et al.

[11] Patent Number: 5,764,063
[45] Date of Patent: Jun. 9, 1998

[54] MONITOR FOR BATTERY PACK

[75] Inventors: Shinji Katou; Yasuyuki Sando, both of Saitama-ken, Japan

[73] Assignee: Honda Giken Kogyo Kabushiki Kaisha, Tokyo, Japan

[21] Appl. No.: 685,569

[22] Filed: Jul. 24, 1996

[30] Foreign Application Priority Data

Jul. 28, 1995 [JP] Japan .................. 7-211422

[51] Int. Cl.$^6$ .................. H02J 7/04; G01R 27/26
[52] U.S. Cl. .................. 324/434; 320/48; 324/433
[58] Field of Search .................. 324/427, 434, 324/433; 320/48, 22; 340/636; 429/7

[56] References Cited

U.S. PATENT DOCUMENTS

| | | | |
|---|---|---|---|
| 4,061,956 | 12/1977 | Brown | 320/22 |
| 4,303,877 | 12/1981 | Meingold | 320/6 |
| 4,443,752 | 4/1984 | Newman | 320/22 |
| 4,585,713 | 4/1986 | Pathe | 429/112 |
| 5,582,928 | 12/1996 | Farley | 429/7 |

*Primary Examiner*—Maura K. Regan
*Attorney, Agent, or Firm*—Armstrong, Westerman, Hattori, Mcleland & Naughton

[57] ABSTRACT

For measuring a temperature with a thermistor, an electrical circuit including the thermistor and resistors for voltage division has to be maintained in the normally energized state and a variation in the voltage caused by resistance variation is detected. This requires a considerable amount of power consumption. On the other hand, thermal reed switches SW1 to SWn are mounted on the surfaces of the unit cells 1-1 to 1-n included in the battery pack 10. Each of the thermal reed switches is connected at one end to a common power source VDD and at the other end to a corresponding input terminal of a selector switch 20. The selector switch 20 is responsive to a switch signal from a determining unit 30a for passing selectively and periodically input signals of the input terminals to the determining unit 30a which in turn detects the temperature of a corresponding unit cell on the basis of the input signal selected by the switch signal.

13 Claims, 3 Drawing Sheets

MONITOR FOR BATTERY PACK

BACKGROUND OF THE INVENTION

1. Field of the Invention

The present invention relates to a monitor and a protection device for storage battery pack, and more particularly, to a monitor and a protection device appropriate for monitoring and protecting a battery pack which comprises a plurality of unit cells.

2. Description of the Prior Art

As advanced electric motor vehicles have been developed, among batteries as power sources are now focused on an Ni—MH (nickel—hydrogen cells) battery. The Ni—MH battery is however relatively small in the electromotive force of each unit cell (electrolyte cell), and in which a multiplicity of the unit cells are connected in series for producing a desired high voltage output and used as a power source for an electric motor vehicle.

In such a battery pack comprising a number of unit cells, if the unit cells are not uniform in the voltage and storage capacity, it causes overcharge or overdischarge of each unit cell thus resulting in temperature or pressure rise, or decrease of the storage capacity and shortening the life of the battery pack. It is hence essential for the battery pack of this type to continuously monitor the storage, voltage, current, pressure, and other requirements of each unit cell. In the prior art, the requirements to be monitored in each unit cell are detected by their respective sensors which are thus bulky and require a large area of wiring installation.

Any variation in the storage, voltage, current, and pressure of the Ni—MH battery appears as a temperature variation in a part of the battery, e.g. on the outer wall of the unit or electrolyte cell. It can thus be determined that the monitored requirements stay within normal ranges if the temperature rise is not more than a predetermined reference level. In other words, the condition of requirements to be monitored for the Ni—MH battery are able to be represented by thermal variations or temperatures.

The detection of temperature is commonly effected by means of a thermosensor such as thermistor which detects the temperature variation as a variation in its electrical resistance. Each thermistor has a different relationship between its resistance and temperature and its resistance value is not proportional to the temperature. The thermistors, therefore, have to be adjusted in a variety of settings one by one when used as a temperature sensor.

When the thermistors are used for detecting the resistance variation, an electric circuit including thermistors and resistor elements for voltage division is kept energized to measure a voltage variation representing the temperature variation, increasing the consumption of power. The thermistor is hence unfavorable as a temperature sensor for batteries equipped on conventional motor vehicles in which shortage of the power storage capacity of batteries is a big obstacle for practical use.

In addition, when any fault generated in the batteries is detected, it is indicated only with a warning lamp illuminating, but no positive protection system for the batteries has been proposed against possible faults. Keeping on a high-speed or uphill run with the batteries having a fault increases the rate of discharge and may accelerate deterioration of the batteries.

SUMMARY OF THE INVENTION

It is an object of the present invention to provide a monitor and a protection device for battery pack which are simple in the construction but capable of detecting any fault in each battery with a very low power consumption and if a fault occurs, reducing load to the battery pack to prevent from unexpected deterioration. The present invention is featured by the following aspects.

(1) A monitor for battery pack including a multiplicity of unit cells connected in series to one another and grouped into blocks, each block containing at least one unit cells, comprising: thermosensitive switches, each mounted to the block, for changing over their open/close state when the temperature of any unit cell in the block departs from a predetermined range; and a determining means responsive to the open/close state of the thermosensitive switch for determining whether the unit cell in the corresponding block is defective or not. When the thermosensitive switch is a thermal reed switch (reed relay), its normally open or close contact state changes over to the opposite state upon the temperature of the unit cell reaching the Curie point of thermal ferrite. As the thermal reed switch is connected at one end to a power source, the other end receives a source voltage when its contact is closed but no voltage when the same is open. Accordingly, if a voltage is detected at the other end of any thermal reed switch, it is judged that the temperature in a corresponding unit cell reaches the Curie point. The Curie point of the thermal ferrite can be set at any desired level. When the Curie point of the thermal ferrite is set at a level corresponding to a battery fault, therefore, the detection of any resultant voltage detection indicates that the fault occurs.

(2) Each of the thermosensitive switches is connected in series with a resistor which has a unique resistance value and one end of the series connection is connected to a common power source for allowing the detection of a voltage at the other end of the series connection. As the detected voltage varies depending on which thermosensitive switch has changed the close/open state of the contact, it can be used to identify a unit cell in fault.

(3) It is arranged such that when the detected temperature in any unit cell exceeds a predetermined level, at least one of the current supply out of the battery pack or the current charge into the battery pack is controlled not to exceed a predetermined specific level. This will allows the battery pack to be prevented from being over loaded and unexpected deterioration.

DETAILED DESCRIPTION OF THE PREFERRED EMBODIMENTS

Figure 1:
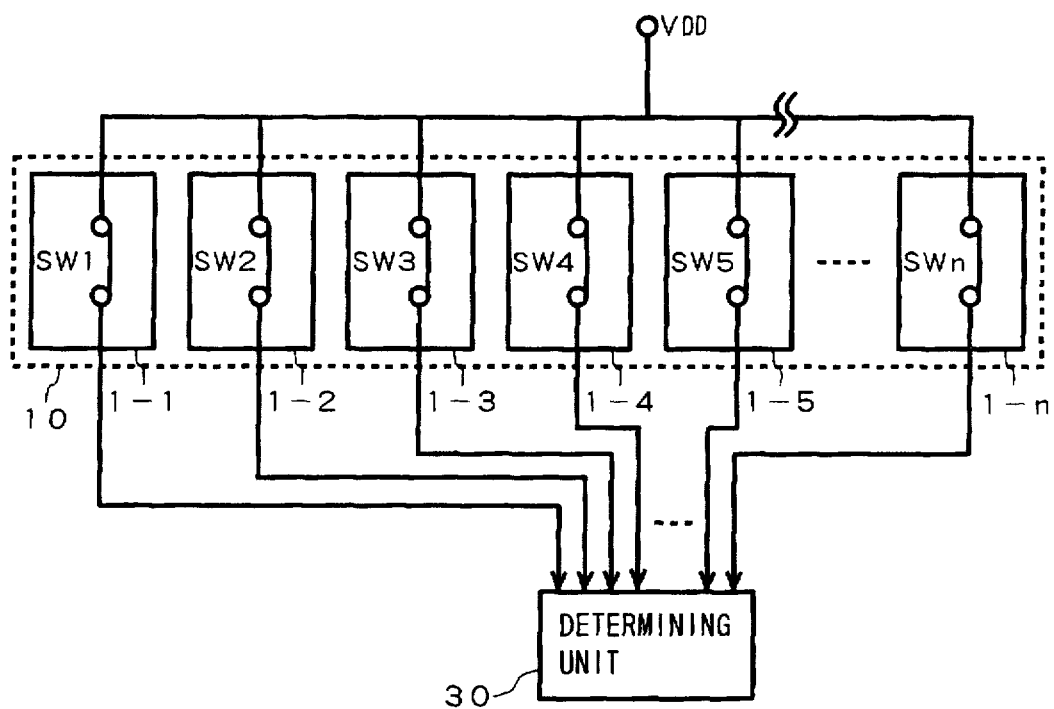
FIG. 1 is a block diagram of a primary part of a battery monitor showing a first embodiment of the present invention.

The present invention is described in more details referring to the accompanying drawings. FIG. 1 is a block diagram of a primary part of a battery monitor according to the first embodiment of the present invention.

A battery pack 10 includes a plurality of unit cells 1-i (1-1 to 1-n) connected each other in series, and each unit cell 1-i is provided at its surface (for example, on a wall surface of its electrolyte cell) with a thermal reed switch SWi (SW1 to SWn) which is installed to maintain a good thermal conductivity therewith. The thermal reed switch is a kind of electro-magnetic thermal sensors for monitoring the temperature on the basis of the Curie point of its magnetic material (e.g. ferrite), and comprises a combination of thermal ferrite which sharply shifts from ferromagnetic to paramagnetic above the Curie point, ferrite magnet, and a reed switch.

In this embodiment, the Curie point of the thermal ferrite in each thermal reed switch is set at a specific temperature which is indicative of the occurrence of a fault in the unit cell. The thermal reed switch is well known in the operating principle and structure and will be explained in no more detail.

The reed switch SWi is connected at one end to a common power source VDD and at the other end to a corresponding input terminal of a determining unit 30. The determining unit 30 on receiving a signal from the thermal reed switch SWi examines whether or not the temperature of the unit cell 1-i reaches the Curie point and determines the presence or absence of a fault in the unit cell 1-i.

In case that the thermal reed switch SWi is of a break type, it remains in its closed state when the unit cell 1-i is normal with its temperature being below the Curie point of the thermal ferrite. This allows the input terminal of the determining unit 30 to be connected directly to the power source VDD. At the time, the power consumption includes a power required for only activating the determining unit 30, but non for the thermal reed switch SWi and will be saved as compared with the use of a thermal sensor of thermistor type.

If any unit cell 1-i has an internal fault and its temperature rises to the Curie point of the thermal ferrite, the contact of the thermosensitive reed switch SW1 allocated to the unit cell 1-i is opened, thus allowing the input terminal of the determining unit 30 connected to the thermosensitive reed switch SWi not to receive and detect the source voltage VDD. Accordingly, the temperature rise in the unit cell 1-i is recognized.

In case that the thermal reed switch SWi is of a make type, it remains in its open state when the unit cell 1-i is normal with its temperature being below the Curie point of the thermal ferrite. This permits the determining unit 30 to be disconnected from the power source VDD.

Upon a fault occurring and increasing the temperature of the thermal ferrite to the Curie point in a particular unit cell, the thermal reed switch SWi on the particular unit cell is closed to pass a power source voltage VDD to a corresponding input terminal of the determining unit 30 which in turn detects an abnormal temperature rise in the unit cell.

Since the thermal sensors in the embodiment are the thermal reed switches, their power consumption is minimized and their adjustment on various settings which is indispensable in the prior art is eliminated.

Figure 2:
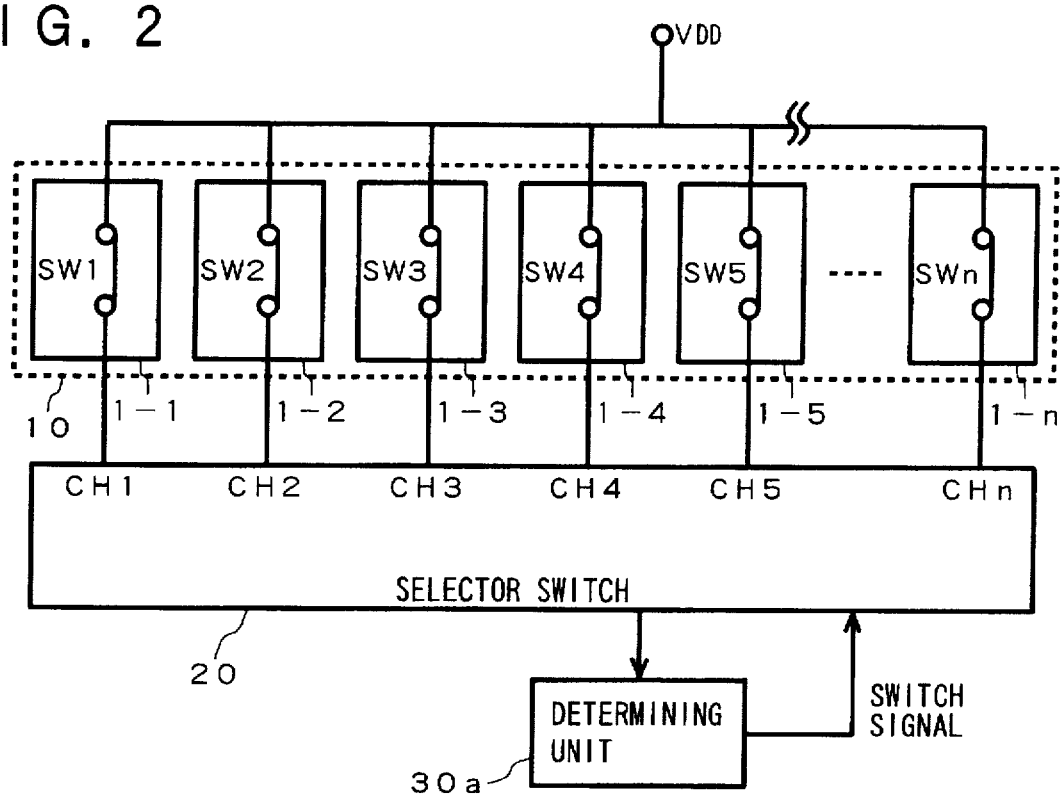
FIG. 2 is a block diagram of a primary part of a battery monitor showing a second embodiment of the present invention.

FIG. 2 is a block diagram of a primary part of a battery monitor according to the second embodiment of the present invention, in which the same or similar components are denoted by the same numerals as those in the first embodiment. While the determining unit 30 of the first embodiment has a plurality of the input terminals, a determining unit 30a of the second embodiment has only one input terminal.

In this embodiment, each thermal reed switch SWi is connected at one end to a common power source VDD and at the other end to a corresponding input terminal of a selector switch 20. In response to a switch signal from the determining unit 30a, the selector switch 20 passes input signals from the switches to the determining unit 30a selectively and periodically. The determining unit 30a examines the input signal received in response to the switch signal to decide whether or not a temperature of the corresponding unit cell 1-i reaches the Curie point, and thus determines the presence or absence of a fault in the unit cell 1-i.

The operation of the case in which the thermal reed switch SWi is of either a brake or a make type has been described with the first embodiment and will be no more explained.

Figure 3:
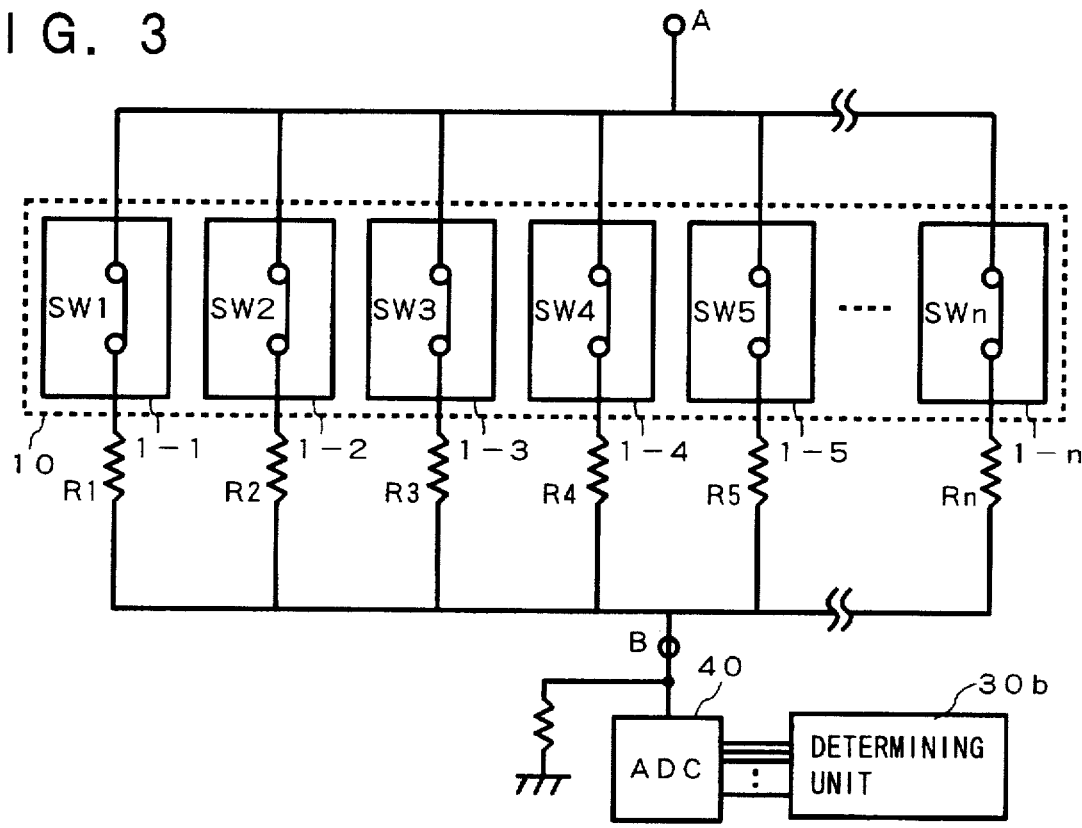
FIG. 3 is a block diagram of a primary part of a battery monitor showing a third embodiment of the present invention.

FIG. 3 is a block diagram of a primary part of a battery monitor according to the third embodiment of the present invention, in which like components are denoted by like numerals as those in the first embodiment. In this embodiment, each thermal reed switch SWi is connected at one end in series to one of resistors R1 to Rn which have resistance values different each other. The other end of each thermal reed switch SWi is connected to a common terminal A, while the other ends of the resistors R1 to Rn are connected to a common terminal B. The connection of the resistors R1 to Rn is not limited to the embodiment shown so long as they are connected in series to their corresponding thermal reed switches SWi.

In case that each thermal reed switch SWi is of a break type, it remains in its closed state when each corresponding unit cell 1-i is normal with its temperature being below the Curie point of the thermal ferrite. Accordingly, the resistance value between the two terminals A and B is equal to a parallel resistance value of all of the resistors R1 to Rn.

If a fault occurs and increases the temperature of the thermal ferrite to the Curie point in any of the unit cell, the thermal reed switch SWi mounted on the unit cell of fault is open thus increasing the parallel resistance between the two terminals A and B due to a resistance value of the resistor connected in series with said switch SWi. When a determining unit 30b is powered via an A/D converter 40 with a voltage at the terminal B with the terminal A being connected to a stationary power source, it detects the temperature rise in the unit cell on the basis of the loaded or inputted voltage. As the resistors in this embodiment have resistance values different each other, the inputted voltage allows the determining unit 30b to identify the unit cell in which the fault occurs.

In case that each thermal reed switch SWi is of a make type, each of switches SW1-SWn remains in its open state when the temperature of the corresponding unit cell is below the Curie point of its thermal ferrite. Accordingly, the resistance between the two terminals A and B is infinite. If a fault occurs and increases the temperature to the Curie point of thermal ferrite in any of the unit cells, the corresponding thermal reed switch SWi on the unit cell of fault is closed thus causing the resistance value between the two terminals A and B to be equal to a resistance value of the resistor connected in series thereto. Accordingly, when the determining unit 30b is loaded via the A/D converter 40 with a voltage at the terminal B with the terminal A being connected to the stationary power source, it identifies the unit cell in which the fault has occurred, on the basis of the loaded voltage.

In case that the thermal reed switch SWi is of a make type, the power consumption in the resistors R1 to Rn is effected only by a battery fault. As the resistors R1 to Rn consume no power in the normal state, the overall power consumption will be minimized.

Figure 4:
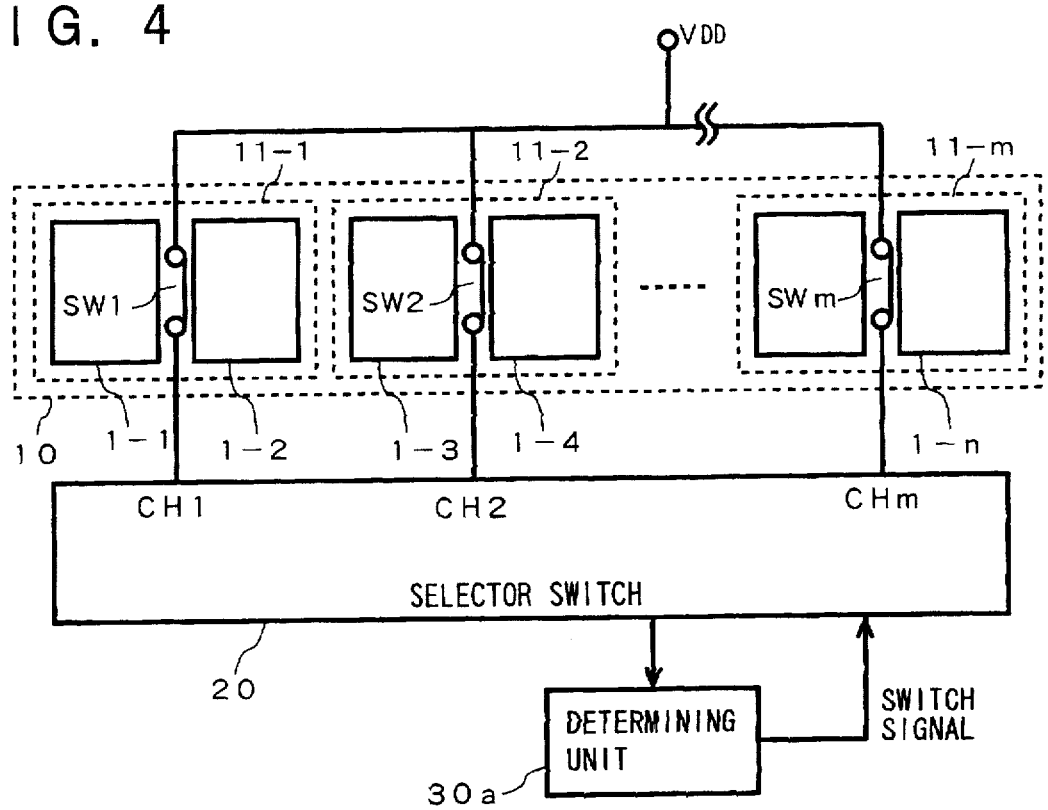
FIG. 4 is a block diagram of a primary part of a battery monitor showing a fourth embodiment of the present invention.
Figure 5:
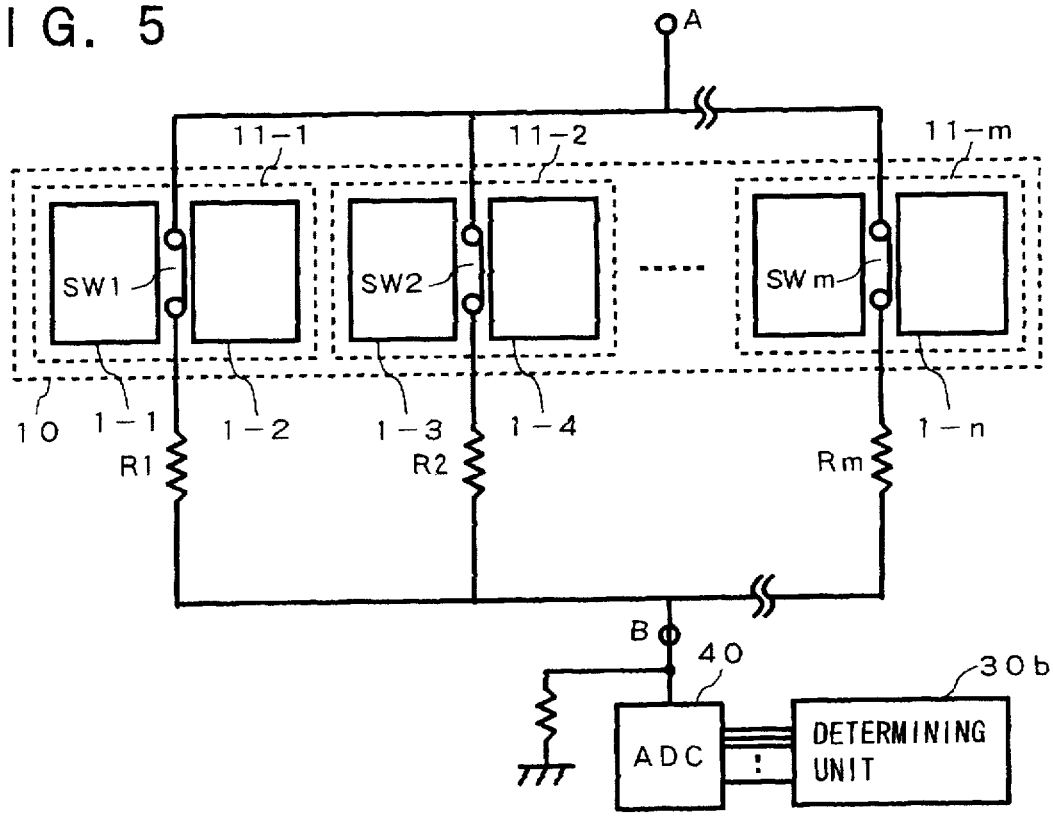
FIG. 5 is a block diagram of a primary part of a battery monitor showing a fifth embodiment of the present invention.

The present invention is not limited to the previously described embodiments where the unit cells in a battery pack are accompanied with their respective thermal reed switches. As shown in the fourth and fifth embodiments of FIGS. 4 and 5, respectively, a battery pack 10 may be divided into a plurality of blocks 11-1 to 11-m, each block containing a plurality of unit cells and provided with a thermal reed switch. If each block contains two unit cells as shown in FIG. 4 or 5, the thermal reed switch is mounted on an interface between the two unit cells so that it can detect a temper-ature deviation out from the range in either unit cell and change its contact state.

Also, the present invention is not limited to the thermal reed switches as the thermosensitive detectors, but any other devices including a thermostat may be used in which their contacts are open or closed in response to a temperature variation. Such a thermosensitive device may be of a non-mechanical contact type or a semiconductor switch which sharply varies its internal electrical resistance in response to a temperature variation thus functioning as a switch in practice.

Figure 6:
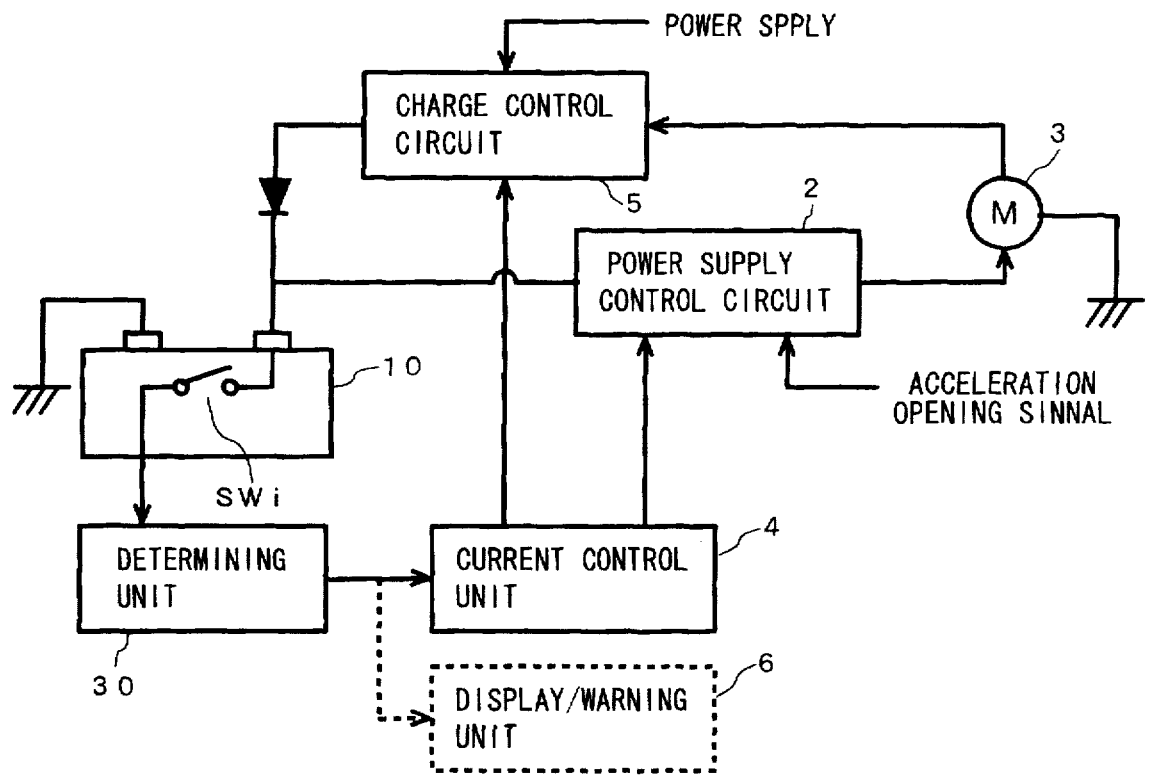
FIG. 6 is a functional block diagram of a battery protection device showing a sixth embodiment of the present invention.

FIG. 6 is a functional block diagram of a battery protection apparatus according to the sixth embodiment of the present invention, in which like components are denoted by like numerals as those of the previous embodiments.

A battery 10 and a drive motor 3 are connected to each other by a power supply control circuit 2 and a charge control circuit 5. The power supply control circuit 2 controls a power supply of the battery 10 to the drive motor 3 according to an acceleration angle signal and when the acceleration angle is widened for running at a higher speed or along an uphill, increases the power supply out of the battery 10 to the drive motor 3. The charge control circuit 5 controls charging a power from an external source to the battery 10 and a power regenerated by the motor 3 for regenerative breaking to the battery 10. The battery 10 is provided with a thermal reed switch SWi which is identical to that described in the first or second embodiment. The opening and closing of the thermal reed switch SWi are detected by a determining unit 30 (30a or 30b) in the same manner as described above.

When the determining unit 30 detects a fault in any of the unit cells, a current control unit 4 commands the feed control unit 2 for limiting the supply (discharge) of current and the charge control unit 5 for limiting the charge of current. Accordingly, the feed control unit 2 uniformly decreases the proportion of the feed current to the acceleration angle signal, or allows the normal control operation until a predetermined angle is achieved and then maintains a constant feed current regardless of an increase of the acceleration angle signal, or performs any other appropriate current control process to save the load on the battery 10. Similarly, the charge control unit 5 decreases the charge current below a predetermined level to lighten the load on the battery 10. It is also preferable to have a display/warning unit 6 for displaying a message indicative of occurrence of the fault and/or recommendation of stopping running, and/or for emitting a warning sound while the prescribed current control is applied.

According to this embodiment, when a fault occurs in any unit cell in the battery pack, either the current supply from the battery pack to any electric device or the current charge to the battery pack is limited so that the battery pack is prevented from unwanted over load and its unexpected deterioration will be avoided.

The advantages of the present invention are as follows:

(1) The thermal reed switches are used as thermal sensor for the battery pack, thus allowing the overall power consumption to be remarkably decreased and enhancing the utilization of the battery pack.

(2) The thermal switches are connected in series to their respective resistors of which unique resistance values are different from each other, thus allowing any unit cell in fault to be located with ease.

(3) The supply of current from the battery pack to any electrical device and the charge current to the battery pack is limited upon detection of a predetermined temperature rise in the battery pack for lightening the load on the battery, whereby the unexpected deterioration of the battery pack will be avoided.

What is claimed is:

1. A monitor for a battery pack, which includes a multiplicity of unit cells connected to one another and being grouped into blocks, each block containing at least one unit cell, comprising:

thermosensitive switches, each mounted to the respective block, for switching over an open/close state thereof when the temperature of any unit cell in the block departs from a predetermined range;

connecting means for commonly connecting each of the thermosensitive switches to a power source at one end thereof;

a selector switch for selecting one of the thermosensitive switches, and passing a voltage which appears at the other end of a selected thermosensitive switch; and determining means for determining whether any unit cell in the block accompanied with the thermosensitive switch which is selected is defective or not on the basis of the voltage passed by the selector switch.

2. A monitor for a battery pack according to claim 1, wherein the thermosensitive switch are thermal reed switches.

3. A monitor for a battery pack according to claim 1, wherein the battery pack is adapted as a power source for an electric motor vehicle.

4. A monitor for a battery pack according to claim 1, wherein the unit cells are Nickel—hydrogen cells.

5. A monitor for a battery pack according to claim 1, wherein when a fault occurs in any of the unit cells, at least one of a supply or discharge of current out of the battery pack and a charge of current into the battery pack is limited.

6. A monitor for a battery pack according to claim 3, wherein when a fault occurs in any of the unit cells, a message is displayed for recommending cease of running the electric motor vehicle.

7. A monitor for a battery pack which includes a multiplicity of unit cells connected to one another and being grouped into blocks, each block containing at least one unit cell, comprising:

thermosensitive switches, each mounted to the respective blocks, for switching over their open/close state when the temperature of any unit cell in the block departs from a predetermined range;

a multiplicity of resistors for forming series circuits with corresponding thermosensitive switches thereof, wherein each resistor has a unique resistance value;

first connecting means for commonly connecting each of the series circuits to a power source at one end thereof; and determining means for determining whether any unit cell in the block is defective or not on the basis of a voltage which appears at the other end of the corresponding series circuits.

8. A monitor for a battery pack according to claim 7, further comprising second connecting means for commonly connecting each of the series circuits at other ends thereof, wherein the determining means determines whether any unit cell in any block is defective or not on the basis of a voltage which appears at the other ends of the series circuits commonly connected.

9. A monitor for a battery pack according to claim 7, wherein the thermosensitive switches are thermal reed switches.

10. A monitor for a battery pack according to claim 7, wherein the battery pack is adapted as a power source for an electric motor vehicle.

11. A monitor for a battery pack according to claim 7, wherein the unit cells are Nickel—hydrogen cells.

12. A monitor for a battery pack according to claim 7, wherein when a fault occurs in any of the unit cells, at least one of a supply or discharge of current out of the battery pack and a charge of current into the battery pack is limited.

13. A monitor for a battery pack according to claim 10, wherein when a fault occurs in any of the unit cells, a message is displayed for recommending cease of running the electric motor vehicle.

* * * * *